United States Patent
Lu et al.

(10) Patent No.: US 7,843,276 B2
(45) Date of Patent: Nov. 30, 2010

(54) OSCILLATOR

(75) Inventors: Hung-Wen Lu, Pingjhen (TW); Chau-Chin Su, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 55 days.

(21) Appl. No.: 12/193,286

(22) Filed: Aug. 18, 2008

(65) Prior Publication Data

US 2008/0315966 A1    Dec. 25, 2008

Related U.S. Application Data

(63) Continuation-in-part of application No. 11/853,003, filed on Sep. 10, 2007.

(60) Provisional application No. 60/876,830, filed on Dec. 22, 2006.

(30) Foreign Application Priority Data

Dec. 31, 2007    (TW) .............................. 96151630 A

(51) Int. Cl.
*H03B 5/18*    (2006.01)
(52) U.S. Cl. ........................................ 331/57; 331/167
(58) Field of Classification Search ............. 331/117 R, 331/167, 1 A, 57
See application file for complete search history.

(56) References Cited

U.S. PATENT DOCUMENTS

| | | | |
|---|---|---|---|
| 5,949,295 A | 9/1999 | Schmidt | |
| 6,107,893 A | 8/2000 | Forbes | |
| 6,239,640 B1 * | 5/2001 | Liao et al. | 327/218 |
| 6,327,465 B1 | 12/2001 | Forbes | |
| 6,483,347 B1 * | 11/2002 | Baker | 326/82 |
| 6,750,727 B1 | 6/2004 | Sutardja | |
| 6,825,722 B2 | 11/2004 | Segawa | |
| 6,850,106 B1 | 2/2005 | Kunanayagam et al. | |
| 6,903,614 B2 | 6/2005 | Jacobsson et al. | |
| 6,987,425 B1 | 1/2006 | Sutardja | |
| 7,075,380 B2 | 7/2006 | Singh et al. | |
| 7,161,439 B2 | 1/2007 | Paillet et al. | |
| 7,202,726 B2 | 4/2007 | Kunanayagam et al. | |

\* cited by examiner

*Primary Examiner*—Joseph Chang
(74) *Attorney, Agent, or Firm*—Workman Nydegger

(57) ABSTRACT

An oscillation circuit induces a first inverter, a second inverter, a first inductive load, a second inductive load and a capacitive load. A first inverter and a second inverter receive a first signal and a second signal, and invert the first and the second signal to output a first inverted signal and a second inverted signal respectively. An output end of the first inverter is electrically connected to a first inductive load, and an output end of the second inverter is electrically connected to a second inductive load. Further, a capacitive load is electrically connected to the output end of the first inverter and the output end of the second inverter, so as to receive the first and the second inverted signal respectively. The capacitance of the capacitive load changes with a control signal.

16 Claims, 18 Drawing Sheets

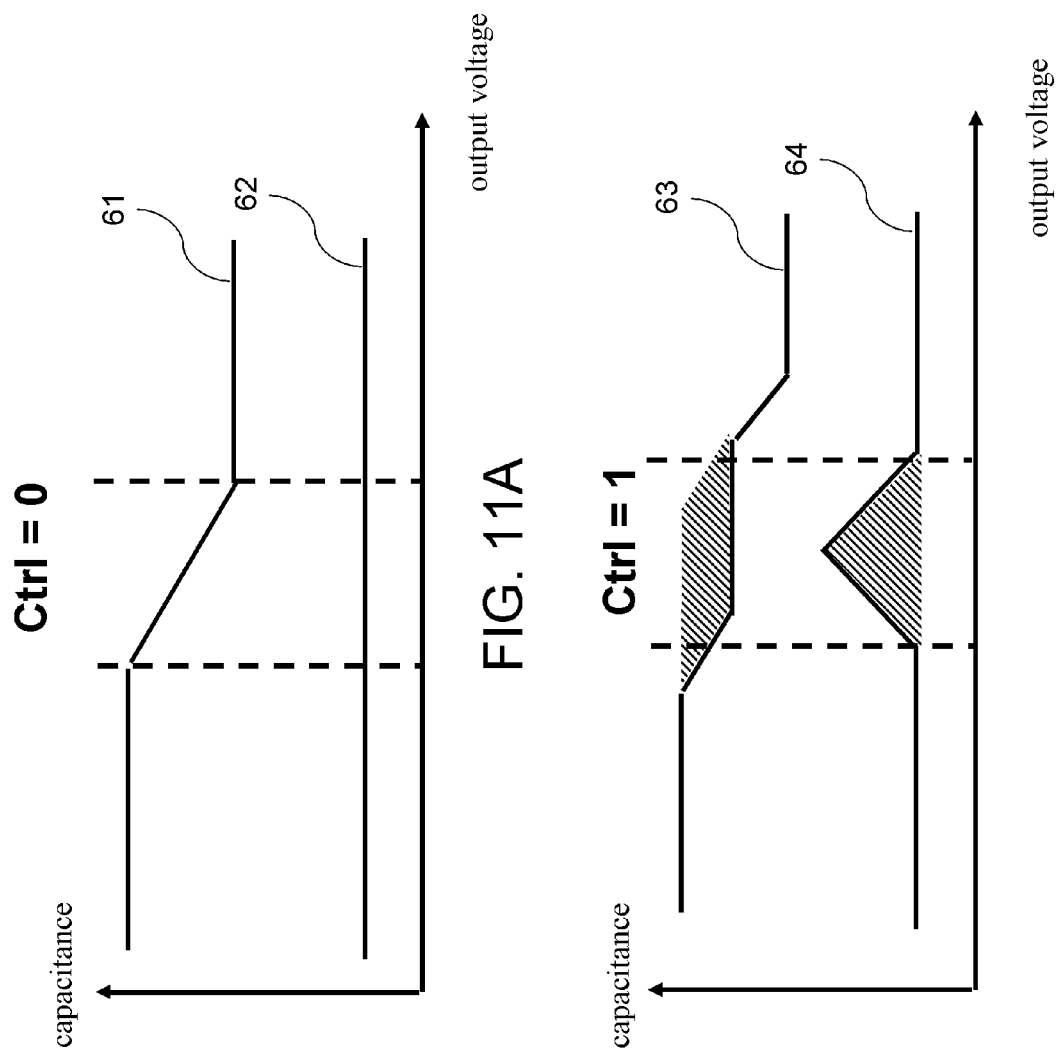

OSCILLATOR

CROSS-REFERENCE TO RELATED APPLICATIONS

This non-provisional application claims priority under 35 U.S.C. §119(a) on Patent Application No(s). 096151630 filed in Taiwan, R.O.C. on Dec. 31, 2007, the entire contents of which are hereby incorporated by reference.

This application is also a continuation-in-part patent application of U.S. application Ser. No. 11/853,003 filed on Sep. 10, 2007, the entire contents of which are hereby incorporated by reference for which priority is claimed under 35 U.S.C. §120.

BACKGROUND OF THE INVENTION

The present invention relates to a capacitive load element, and more particularly to a capacitive load element of an oscillator.

Phase locked loop (PLL) is an indispensable module of a transmission system, mainly for providing clock required for the operation of the system. Generally speaking, a PLL includes a frequency phase detector, a loop filter, an oscillator, and a frequency divider. According to different circuit implementations, a PLL can be classified into an analog PLL and a digital PLL.

In an analog PLL, a linear frequency phase detector compares frequency errors and phase errors between a reference clock and a loop-generated clock, and converts the errors into a voltage output. To stabilize the system and filter high-frequency environmental noises, a loop filter is employed to filter the voltage output. Afterwards, an oscillator adjusts the oscillation frequency according to the output voltage of the filter. When the analog PLL is applied to a system with a reference clock several or tens times larger, a frequency divider is added to divide the frequency of the clock output by the oscillator.

In a digital PLL, a non-linear frequency phase detector only detects the phase lead and phase lag and outputs a one-bit logic 1 or 0, instead of using different output voltages to represent various phase errors. A digital filter consisting of an adder, a multiplier, and a register is used as a loop filter. A digital control oscillation loop is adopted as an oscillator. And the operation and architecture of a frequency divider is identical to those of the analog PLL.

The filter of the analog PLL is formed by passive capacitors and resistors with fixed parameters, so the performance of the system is hard to regulate, and the lock time is long. Further, as a module circuit generally consists of a differential pair and current-source analog circuit, the size of the circuit must be repeatedly adjusted and verified, which increases the complexity in design. However, an analog oscillator has excellent clock precision and high oscillation frequency. The operation of the oscillator is approximately classified into a high-frequency single-phase mode and a low-frequency multi-phase mode. The former is provided by an LC tank oscillator, and the latter is provided by a ring oscillator formed by a delay buffer circuit.

Generally, the digital PLL achieves the purpose of fast-lock by means of binary search. Parameter flexibility of the architecture of the loop filter may be updated by updating the register, and meanwhile the circuit performance may be updated and improved by different types of standard cell libraries. Therefore, the digital architecture has high system integration and high update speed. However, the performance of digital PLL is limited by the digital control oscillator and cannot be applied to a relative high-speed transmission system. According to documents about the current digital control oscillator, the oscillation cycle has a propagation delay of tens logic gates, and the obtained minimum time resolution is a propagation delay of about 0.1 logic gate. Further, the current digital control oscillator cannot provide a multi-phase output. As for an element provided by a 0.18 μm process, the clock resolution is about several ps, and the generated clock jitter is about hundreds of ps, so the element can only be applied in a low-speed transmission system with a transmission speed of about several MHz to tens MHz.

Due to the improvement of the digital circuit process and in the trend of system on chip, a high-speed digital circuit is employed to replace a part of the analog circuit module, so as to enhance the system integration and reduce the circuit cost. Therefore, in order to make a clock supply system easier to update and regulate, the digital PLL is an optimal choice.

SUMMARY OF THE INVENTION

Accordingly, the present invention is directed to a digital oscillator, so as to improve the operating frequency of a digital PLL. In addition to a multi-phase output, the disclosed digital oscillator has a high clock resolution, the clock resolution <0.0001 cycle, and meanwhile achieves a high oscillation frequency with a cycle smaller than ten inverter transmission delays. Through the digital oscillator provided by the present invention, the performance of a digital PLL system may be improved to a transmission system of hundreds of Mbps or even several Gbps.

In a digital oscillator according to an embodiment of the present invention, a first inverter and a second inverter receive a first signal and a second signal, and invert the first and the second signal to output a first inverted signal and a second inverted signal respectively. An output end of the first inverter is electrically connected to a first inductive load, and an output end of the second inverter is electrically connected to a second inductive load. Further, a capacitive load is electrically connected to the output end of the first inverter and the output end of the second inverter, so as to receive the first and the second inverted signal respectively. In addition, the capacitance of the capacitive load changes with a control signal.

The digital oscillator of the present invention achieves a high clock resolution (the resolution is smaller than 0.0001 clock cycle), a high oscillation frequency (the oscillation cycle is smaller than 10 standard inverter delays), and a multi-phase output (>2 phases).

Compared with the conventional analog design, the digital oscillator of the present invention has a simpler design. The circuit performance is regulated by changing the combination of digital circuit units, instead of fine adjusting the size of each transistor, so it takes less time in redesign when the process is transited.

As the digital oscillator of the present invention is implemented by the digital circuit units, the use of large-sized passive devices such as inductors, capacitors, and resistors, and large-sized active devices such as current sources are reduced. Thus, the circuit area is reduced, and the oscillator may operate at a low voltage.

BRIEF DESCRIPTION OF THE DRAWINGS

The present invention will become more fully understood from the detailed description given herein below for illustration only, and thus are not limitative of the present invention, and wherein:

FIGS. 11A and 11B are schematic views showing changes in capacitance of the capacitive load under different control signals;

DETAILED DESCRIPTION OF THE INVENTION

The detailed features and advantages of the present invention will be described in detail in the following embodiments. Those skilled in the arts can easily understand and implement the content of the present invention. Furthermore, the relative objectives and advantages of the present invention are apparent to those skilled in the arts with reference to the content disclosed in the specification, claims, and drawings. The embodiments below are only used to illustrate the features of the present invention, instead of limiting the scope of the same.

Figure 1:
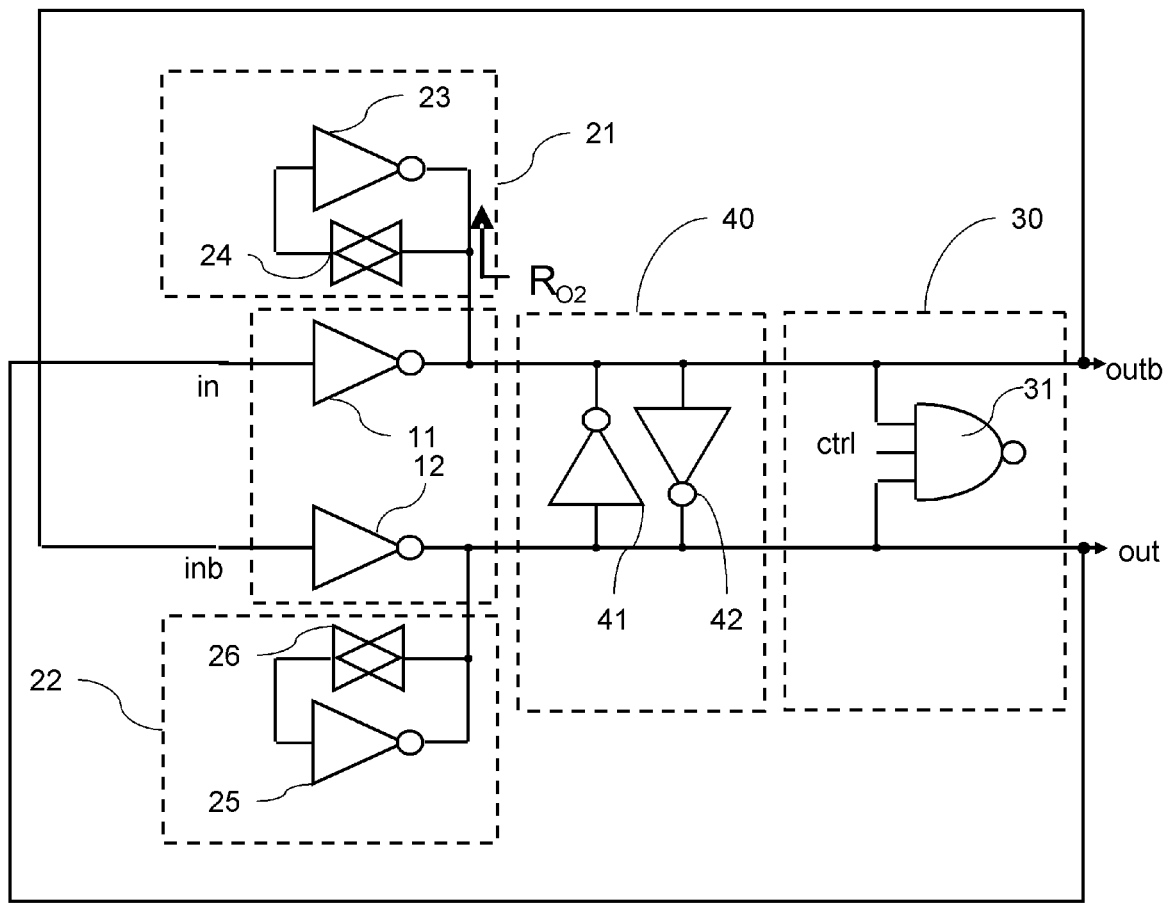
FIG. 1 is a schematic view of a digital control oscillator according to an embodiment of the present invention.

Referring to FIG. 1, a schematic view of a digital control oscillator according to an embodiment of the present invention is shown. The basic principle of the circuit is to adopt an inductive load circuit and a capacitive load circuit to generate resonance, and meanwhile control an equivalent capacitance of the capacitive load circuit through an external signal, so as to tune the resonance frequency. The detailed operation and configuration are described below.

Seen from FIG. 1, the digital control oscillator consists of a first inductive load circuit 21, a second inductive load circuit 22, and a capacitive load circuit 30. The first inductive load circuit 21 and the second inductive load circuit 22 both have inductive properties, and the capacitive load circuit 30 has capacitive properties. Thus, an oscillator is formed by combining the inductive and capacitive properties. In addition, as the first inductive load circuit 21, the second inductive load circuit 22, and the capacitive load circuit 30 consist of digital elements, the oscillation frequencies thereof can be controlled by digital signals.

The first inductive load circuit 21 consists of a first inverter 23 and a first transmission gate 24. The first transmission gate 24 is electrically connected between an input end and an output end of the first inverter 23, and the output end of the first inverter 23 receives a first signal. The second inductive load circuit 22 consists of a second inverter 25 and a second transmission gate 26. The second transmission gate 26 is electrically connected between an input end and an output end of the second inverter 25, and the output end of the second inverter 25 receives a second signal.

The second signal is an inverted signal of the first signal. In an embodiment, two inverters are used to generate the first and second signals by means of differential signals. The first transmission gate 24 and the second transmission gate 26 are resistance elements, and may be MOS transistors or resistors in other embodiments.

The capacitive load circuit 30 consists of an NAND gate 31. The NAND gate 31 has a first input end, a second input end, a third input end, and an output end. The first input end receives the first signal, the second input end receives the second signal, and the third input end receives a control signal Ctrl. The first and the second input ends are defined herein for ease of illustration. In practice, the second input end may be defined as the first input end, and the first input end may be defined as the second input end. The control signal Ctrl may adjust and control capacitances at output ends out and outb of a differential pair.

The first and second signals received by the first inductive load circuit 21 and the second inductive load circuit 22 both come from a differential circuit. In an embodiment, the differential circuit consists of a third inverter 11 and a fourth inverter 12. The first inductive load circuit 21 is electrically connected to an output end of the third inverter 11. The second inductive load 22 is electrically connected to an output end of the fourth inverter 12. After receiving a first input signal by an input end in, the third inverter 11 inverts the first input signal and outputs the first signal. After receiving a second input signal by an input end inb, the fourth inverter 12 inverts the second input signal and outputs the second signal. The third inverter 11 and the fourth inverter 12 are a pair of inverters connected to differential input signals, so the first and second input signals are differential signals.

In an embodiment, the differential pair formed by the first inverter 23 and the second inverter 25 can enhance the signal driving capability and slew rate. In an embodiment, as the common-mode level of input signals of an inverter may directly affect the range of the gain and the input signals, a bias circuit is needed to set the common-mode level of the signals to a switching threshold voltage of the inverter. The first inductive load circuit 21 and the second inductive load circuit 22 may serve as self-bias circuits, for regulating the common-mode level at an output point to the switching threshold voltage of a common inverter.

Further, a noise reduction circuit 40 is coupled to the third inverter 11 and the fourth inverter 12 for filtering noises in the input signals. The noise reduction circuit 40 consists of a fifth inverter 41 and a sixth inverter 42. The fifth inverter 41 has an input end and an output end. The input end of the fifth inverter 41 is electrically connected to the output end out of the fourth inverter 12, and the output end of the fifth inverter 41 is electrically connected to the output end outb of the third inverter 11. The sixth inverter 42 has an input end and an output end. The input end of the sixth inverter 42 is electrically connected to the output end outb of the third inverter 11, and the output end of the sixth inverter 42 is electrically connected to the output end out of the fourth inverter 12.

In the noise reduction circuit 40, the first signal as a positive output signal is applied to the fifth inverter 41, and the fifth inverter 41 further provides a negative output signal. Moreover, the negative output signal provided by the fifth inverter 41 is applied to the sixth inverter 42, and the sixth inverter 42 further provides the positive output signal. Therefore, hysteresis occurs in the noise reduction circuit 40. In addition, the noise reduction circuit having the fifth inverter 41 and the sixth inverter 42 provides a differential-mode voltage offset at the input ends of the third inverter 11 and the fourth inverter 12. Therefore, in order to eliminate the hysteresis, the differential voltage between the first and the second input signal must overcome the voltage offset, thereby achieving a desired common-mode repulsion and reducing the input common-mode noises.

Figure 2:
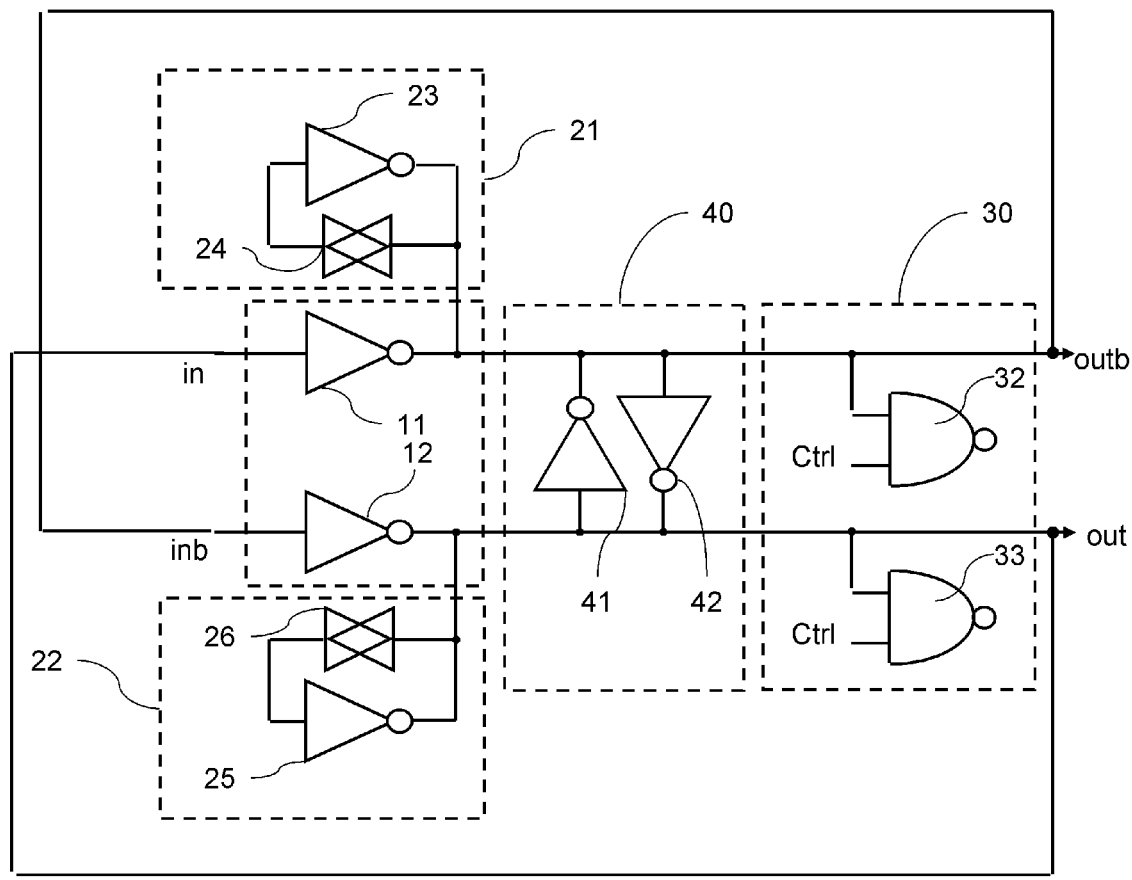
FIG. 2 is a schematic view of a digital control oscillator according to another embodiment of the present invention.

Referring to FIG. 2, a schematic view of a digital control oscillator according to another embodiment of the present invention is shown. The main structure and configuration of this embodiment are identical to the embodiment in FIG. 1, and the difference is that, the capacitive load circuit 30 consists of a first NAND gate 32 and a second NAND gate 33. The first NAND gate 32 and the second NAND gate 33 respectively have a first input end, a second input end, and an output end. The first input end of the first NAND gate 32 is electrically connected to the output end of the third inverter 11, the second input end of the first NAND gate 32 receives a control signal Ctrl, and the output end of the first NAND gate 32 is floating. The first input end of the second NAND gate 33 is electrically connected to the output end of the fourth inverter 12, the second input end of the second NAND gate 33 receives a control signal Ctrl, and the output end of the second NAND gate 33 is floating.

Figure 3:
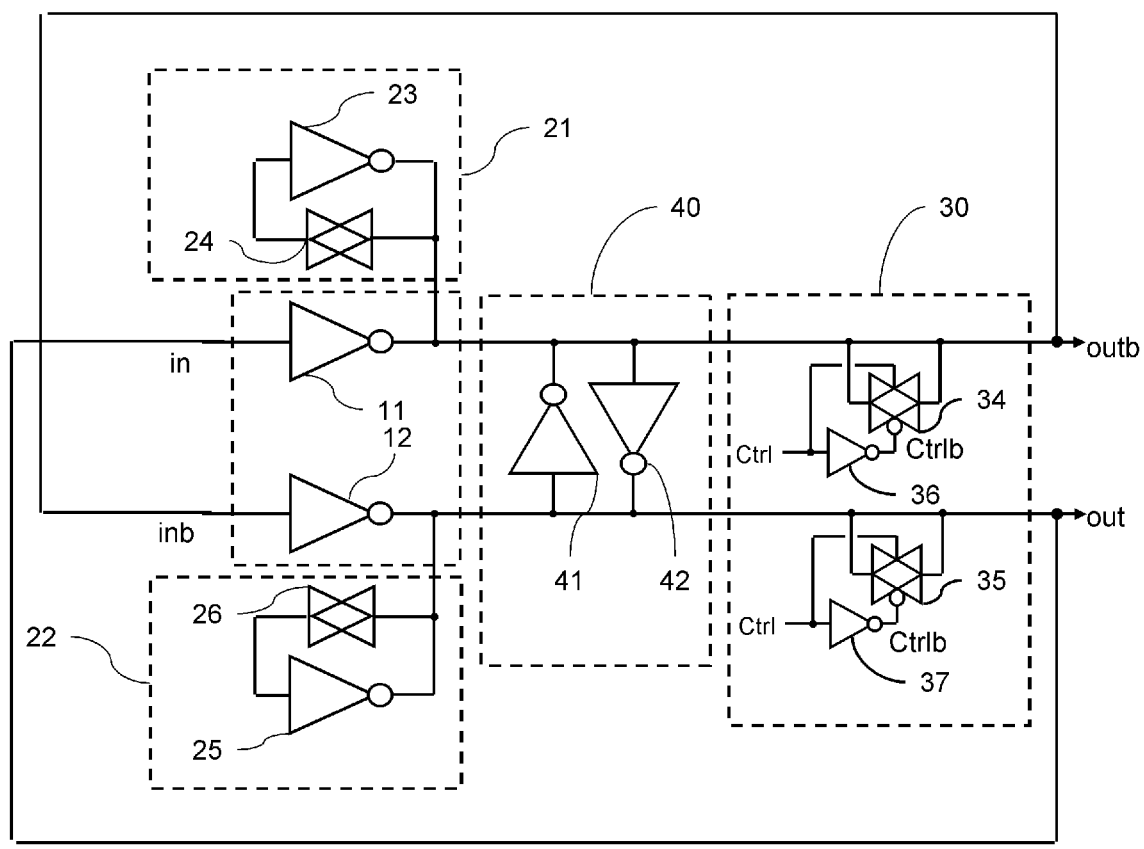
FIG. 3 is a schematic view of a digital control oscillator according to another embodiment of the present invention.

Referring to FIG. 3, a schematic view of a digital control oscillator according to another embodiment of the present invention is shown. The main structure and configuration of this embodiment are identical to the embodiment in FIG. 1, and the difference is that, the capacitive load circuit 30 consists of a third transmission gate 34, a fourth transmission gate 35, a seventh inverter 36, and an eighth inverter 37.

Seen from FIG. 3, an input end and an output end of the third transmission gate 34 are directly interconnected, and further connected to the output end of the third inverter 11. Similarly, an input end and an output end of the fourth transmission gate 35 are directly interconnected, and further connected to the output end of the fourth inverter 12. Both control ends of the third transmission gate 34 and the fourth transmission gate 35 are respectively controlled by a control signal Ctrl. The seventh inverter 36 and the eighth inverter 37 receive and invert the control signal Ctrl, and then output an inverted control signal Ctrlb to another control end of the third transmission gate 34 and the fourth transmission gate 35, respectively.

Figure 4:
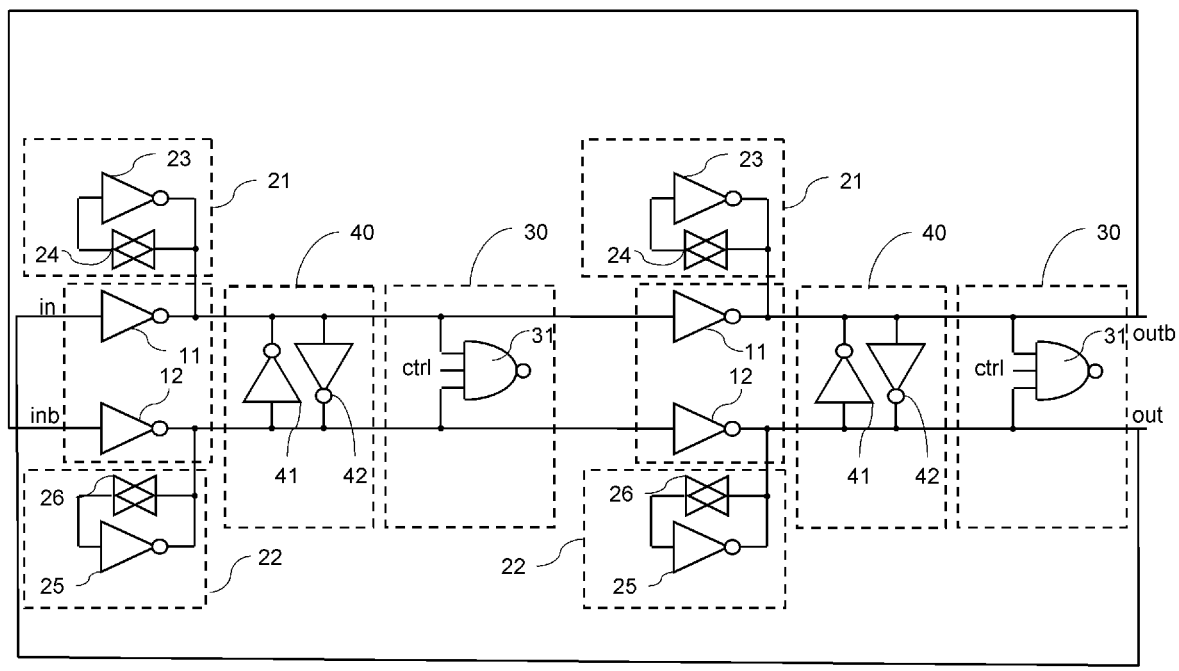
FIG. 4 is a schematic view of a digital control oscillator according to another embodiment of the present invention.

Referring to FIG. 4, a schematic view of a digital control oscillator according to another embodiment of the present invention is shown. This embodiment consists of two stages of the embodiment in FIG. 1. It should be noted that, the two-stage circuit disclosed in this embodiment may also be expanded to above two-stage according to the actual design. When a digital control oscillator provided by an embodiment of the present invention consists of a two-stage or above two-stage circuit, an output of the third inverter of the last stage is electrically connected to an input of the fourth inverter of the first stage, and an output of the fourth inverter of the last stage is electrically connected to an input of the third inverter of the first stage.

Figure 5:
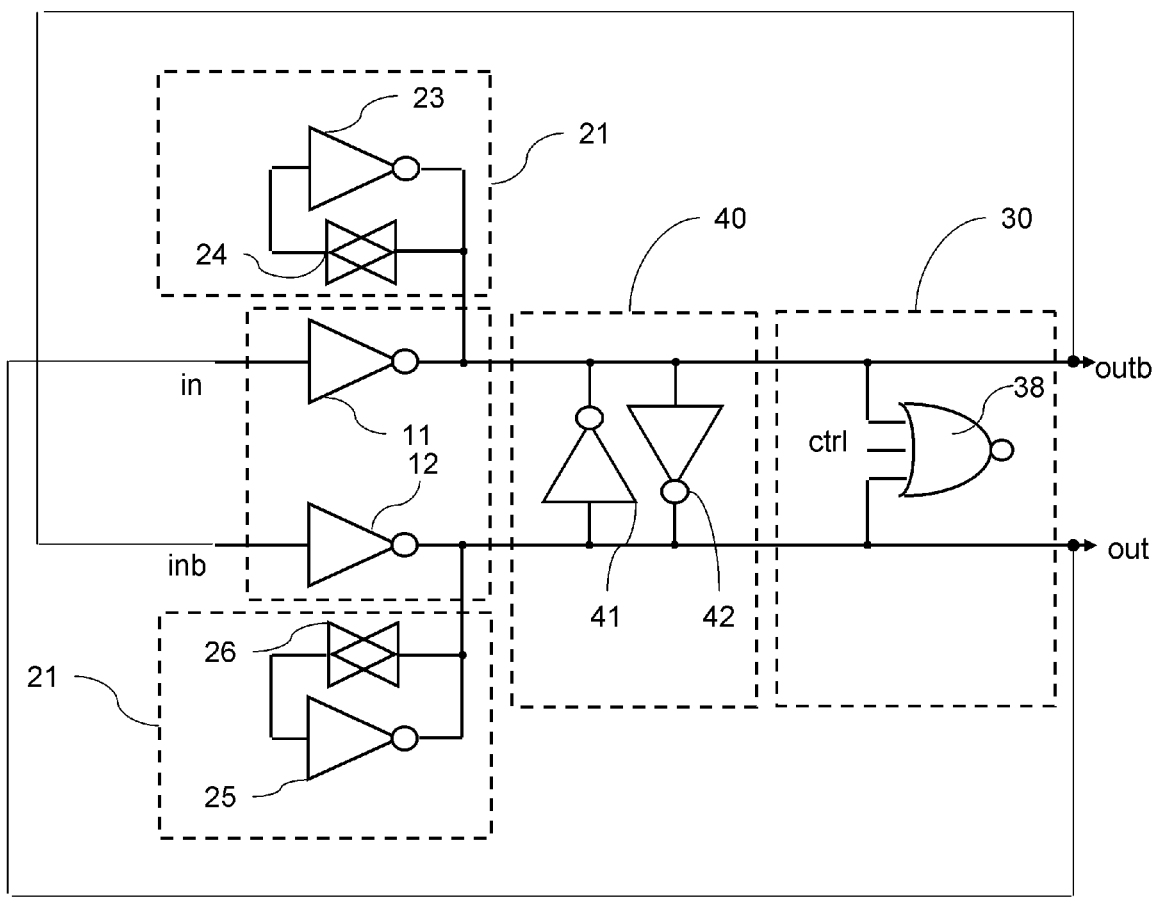
FIG. 5 is a schematic view of a digital control oscillator according to another embodiment of the present invention.

Referring to FIG. 5, a schematic view of a digital control oscillator according to another embodiment of the present invention is shown. The configuration of this embodiment is similar to that of the embodiment in FIG. 1, and the difference is that, the capacitive load circuit 30 is this embodiment consists of a NOR gate 38. The NOR gate 38 has a first input end, a second input end, a third input end, and an output end. The first input end receives a first signal, the second input end receives a second signal, and the third input end receives a control signal Ctrl. The first and the second input ends are defined herein for ease of illustration. In practice, the second input end may be defined as the first input end, and the first input end may be defined as the second input end. The control signal Ctrl may adjust and control capacitances at output ends out and outb of a differential pair.

Figure 6:
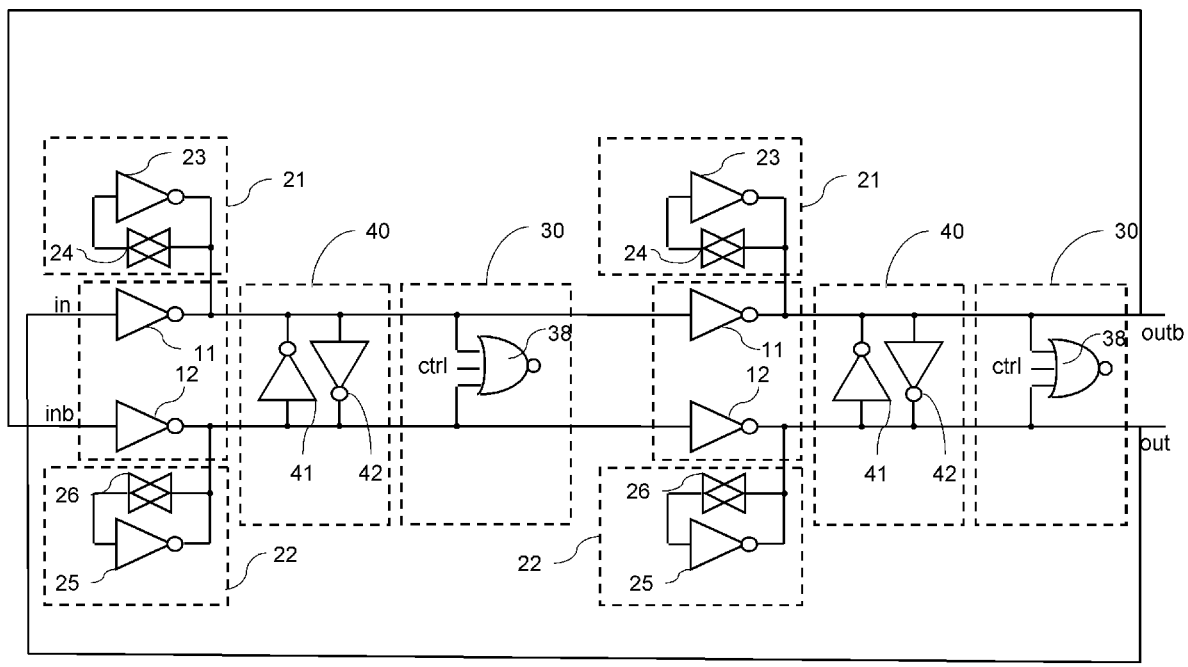
FIG. 6 is a schematic view of a digital control oscillator according to another embodiment of the present invention.

Referring to FIG. 6, a schematic view of a digital control oscillator according to another embodiment of the present invention is shown. This embodiment consists of two stages of the embodiment in FIG. 5. It should be noted that, the two-stage circuit disclosed in this embodiment may also be expanded to above two-stage according to the actual design. When a digital control oscillator provided by an embodiment of the present invention consists of a two-stage or above two-stage circuit, an output of the third inverter of the last stage is electrically connected to an input of the fourth inverter of the first stage, and an output of the fourth inverter of the last stage is electrically connected to an input of the third inverter of the first stage.

Figure 7:
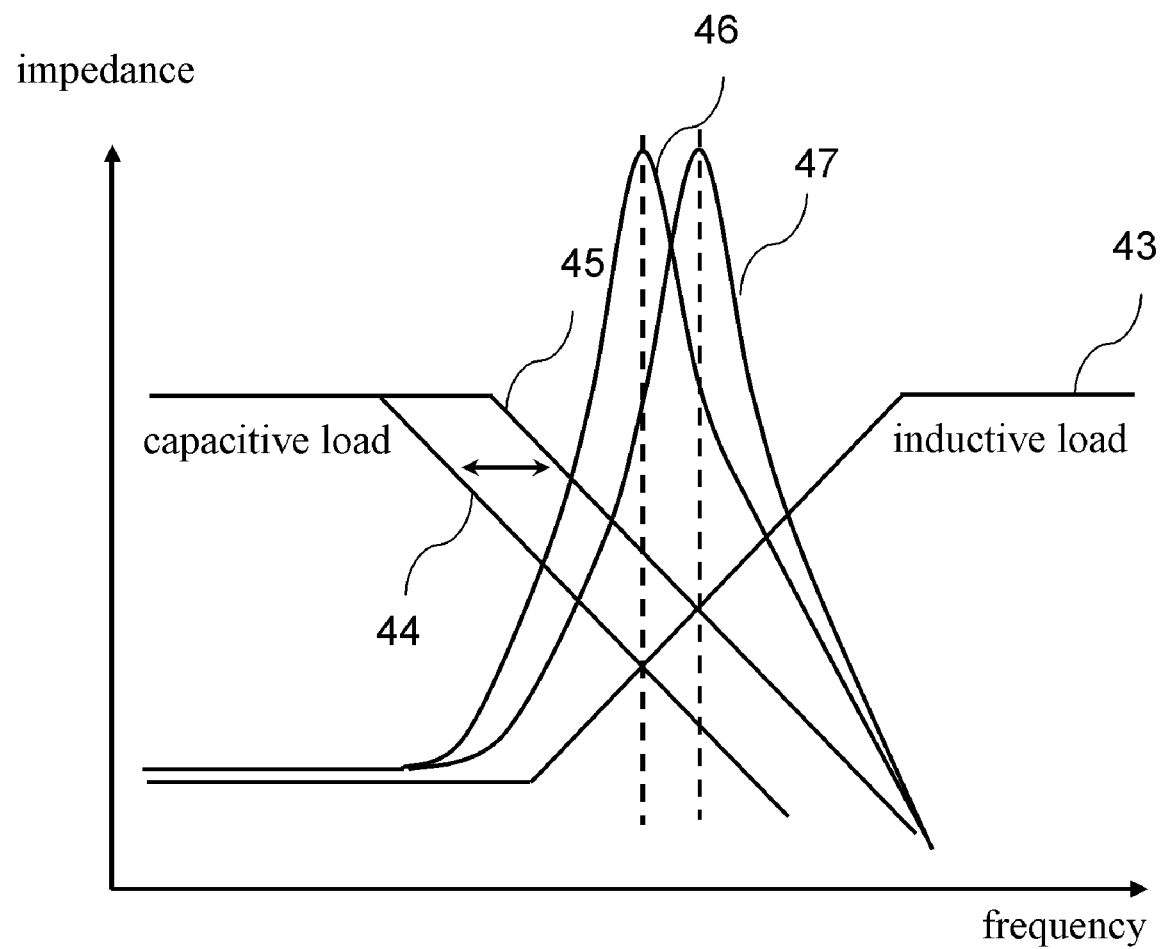
FIG. 7 shows the frequency-impedance relationships of the capacitive load and the inductive load of the present invention.

Referring to FIG. 7, the frequency-impedance relationships of the capacitive load and the inductive load of the present invention are shown. The first inductive load circuit 21 and the second inductive load circuit 22 may be regarded as an inductor, and the frequency-impedance relationship thereof is shown by a curve 43. The capacitance of the capacitive load changes with the control signal, and curves 44 and 45 show the frequency-impedance relationship of the capacitive load with different capacitances. Therefore, the oscillation frequency of the oscillator is $1/\sqrt{(LC)}$, and curves 46, 47 show oscillation frequencies generated by different capacitive loads under the same inductive load.

The principle of the inductive load and the capacitive load of the present invention is illustrated below.

Figure 8A:
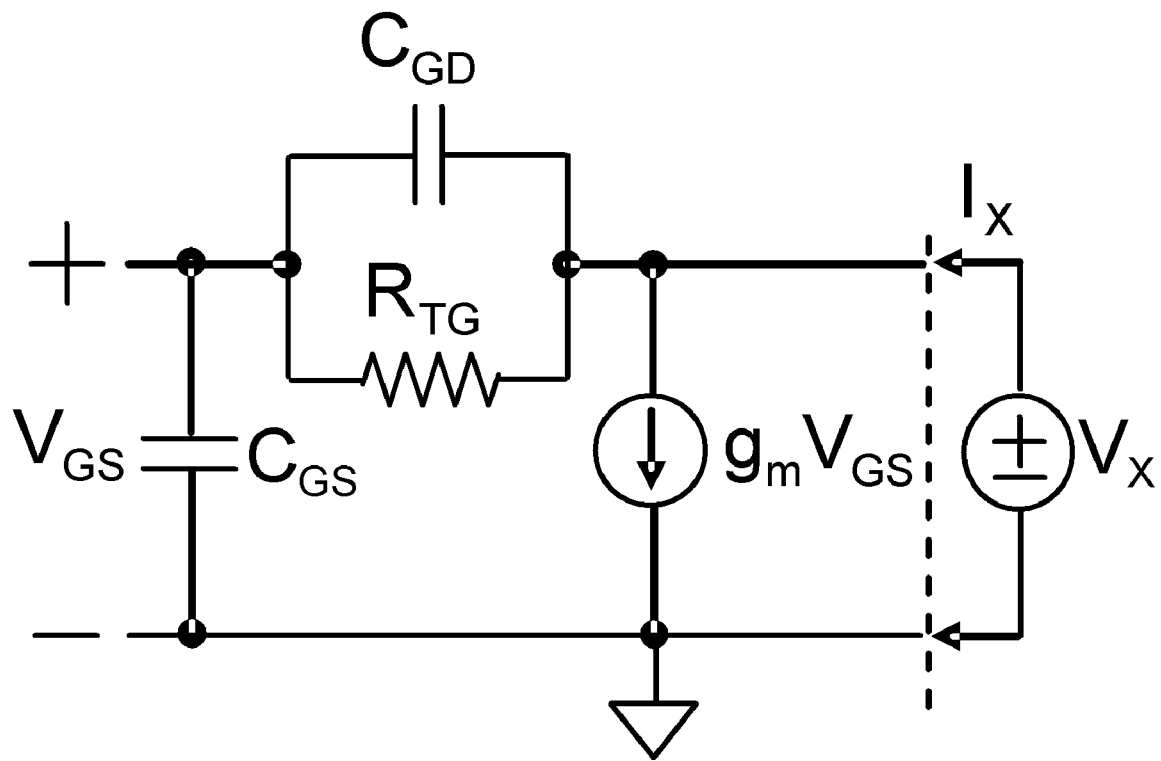
FIG. 8A shows a small signal model of the inductive load according to an embodiment of the present invention.
Figure 8B:
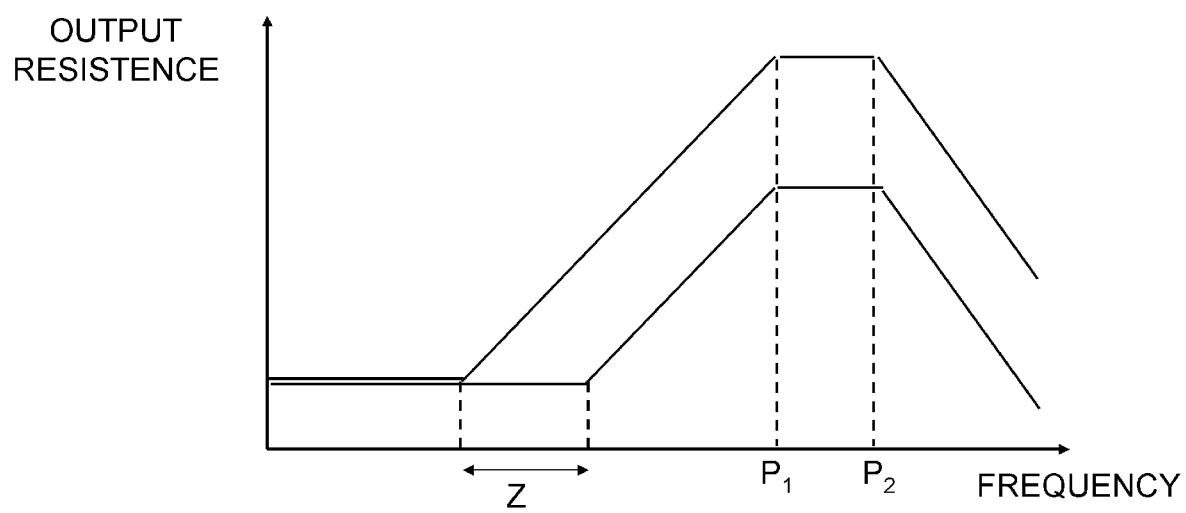
FIG. 8B shows the frequency-impedance relationships of the capacitive load and the inductive load of the present invention.

Referring to FIG. 8, a small signal model of the inductive load is shown. In order to generate an inductive load, a transmission gate is added into a bias circuit. It is assumed that a relative capacitance between an input point and an output point of the first inverter 23 in FIG. 1 is represented by $C_{GD}$, a relative capacitance between the input point and a ground point of the first inverter 23 is represented by $C_{GS}$, a transconductance of the first inverter 23 is represented by $g_m$, and the first transmission gate 24 is equivalent to an active resistor $R_{TG}$.

The total equivalent output impedance of the bias circuit added with the transmission gate can be obtained from the following formula.

$$R_{O2}(s) = \frac{V_X}{I_X} = \frac{(R_{TG} // C_{GD})C_{GS}SV_{GS} + V_{GS}}{C_{GS}SV_{GS} + g_m V_{GS}}$$
$$= \frac{R_{TG}(C_{GS} + C_{GD})S + 1}{(R_{TG}C_{GD}S + 1)(C_{GS}S + g_m)}$$

-continued $$Z = \frac{1}{R_{TG}(C_{GS} + C_{GD})}, P_1 = \frac{1}{R_{TG}C_{GD}}, P_2 = \frac{g_m}{C_{GS}}$$

The output impedance has two poles ($P_1$, $P_2$) and a zero point (Z). The relative position among the poles and the zero point can be adjusted by $R_{TG}$, the first pole $P_1$ and the zero point Z are in invert proportion to $R_{TG}$, and the position of the second pole $P_2$ is not affected by $R_{TG}$.

The relative capacitance $C_{GS}$ may be changed by way of connecting a capacitive load to an input terminal of the inverter of the inductive load. It is noted from FIG. 8B, the position of the zero point (Z) changes. The positions of the first pole $P_1$ and the second pole $P_2$ do not change.

Figure 9:
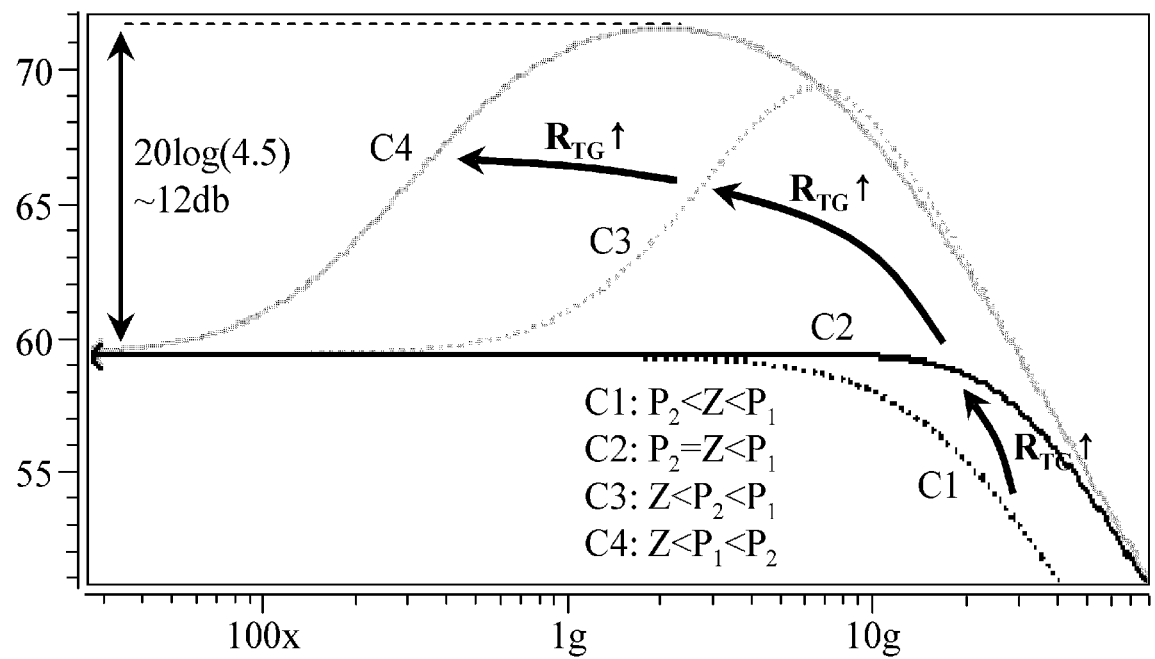
FIG. 9 shows the relationship between $P_2$, $P_1$, and Z under different output impedances of $R_{TG}$.

In FIG. 9, the relationship among $P_2$, $P_1$, and Z under different output impedances of $R_{TG}$ is shown. When $R_{TG}$ is small, the second pole $P_2$ is much smaller than the zero point Z and the first pole $P_1$, such that the output impedance at this moment is dominated by $P_2$, as shown by curves C1 and C2. When $R_{TG}$ is increased to make the zero point Z smaller than the pole $P_2$, the output impedance bulges, as shown by curves C3 and C4, and the frequency bulge may be regarded as the inductive impedance.

Figure 10A:
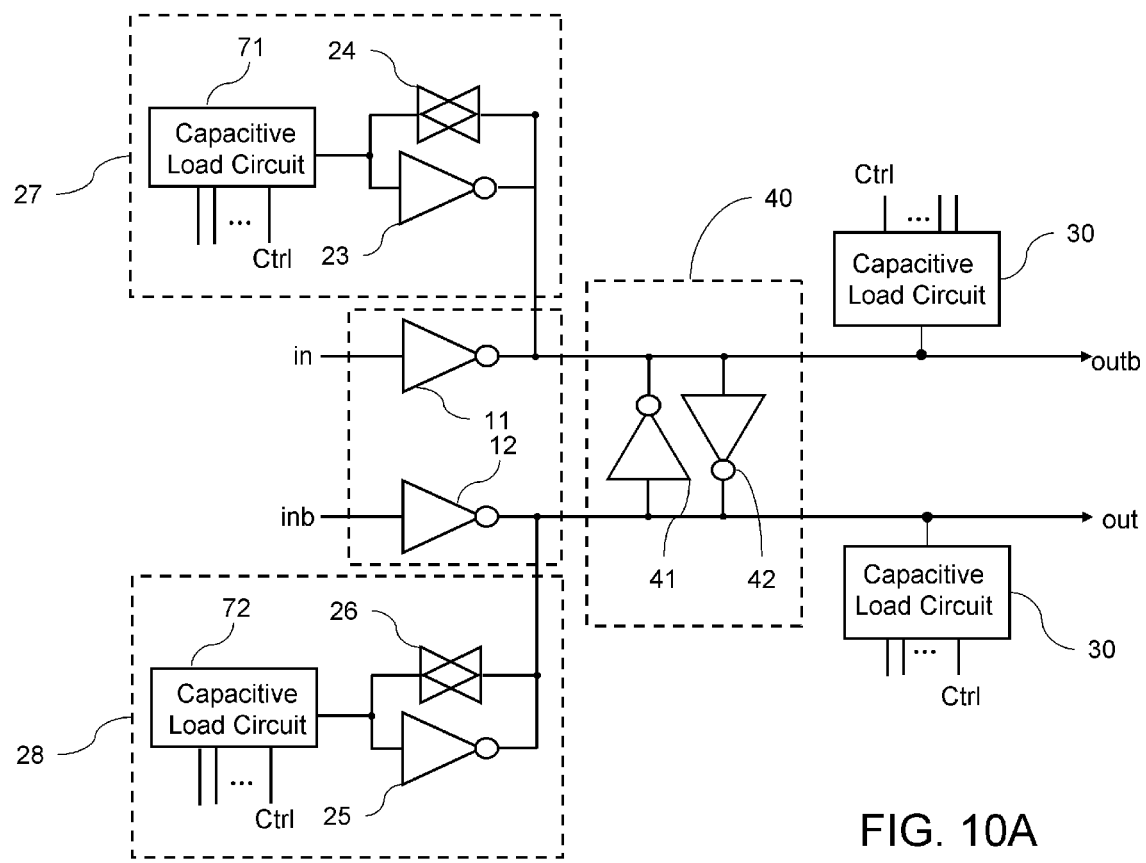
FIG. 10A is a schematic view of a digital control oscillator according to another embodiment of the present invention.

FIG. 10A is a schematic view of a digital control oscillator according to another embodiment of the present invention. In the previous embodiments, the oscillation frequency may be changed by way of adjusting the capacitance of the capacitive load circuit. In this embodiment, the first inductive load circuit 27 includes a capacitive load circuit 71 connected to the input terminal of the inverter 23. The second inductive load circuit 28 also includes a capacitive load circuit 71 connected to the input terminal of the inverter 23. By way of implementing a capacitive load circuit in the inductive load circuit, the inductance of the inductive load circuit may be adjusted by the capacitive load circuit. Thus, the oscillation frequency may be changed by way of adjusting the capacitance of the capacitive load circuit in the inductive load circuit.

Figure 10B:
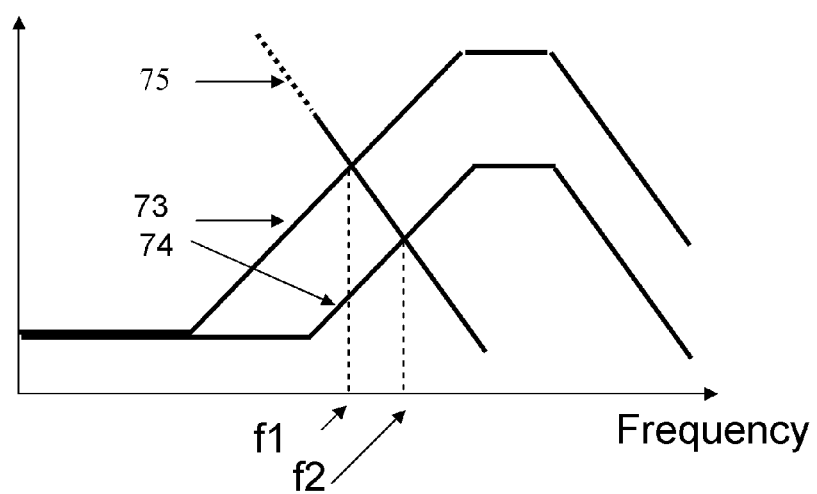
FIG. 10B shows the relationship between the oscillation frequency and the output impedance for the embodiment in FIG. 10A.

FIG. 10B shows the relationship between the oscillation frequency and the output impedance for the embodiment in FIG. 10A. The curve 73 and the curve 74 denote the impedance of the inductive load circuit under different inductance adjusted by the capacitive load circuit. The curve 75 denotes the impedance of the capacitive load circuit. It is noted that the frequency changes from f1 to f2 by adjusting the capacitance of the capacitive load circuit in the inductive load circuit.

Figure 10C:
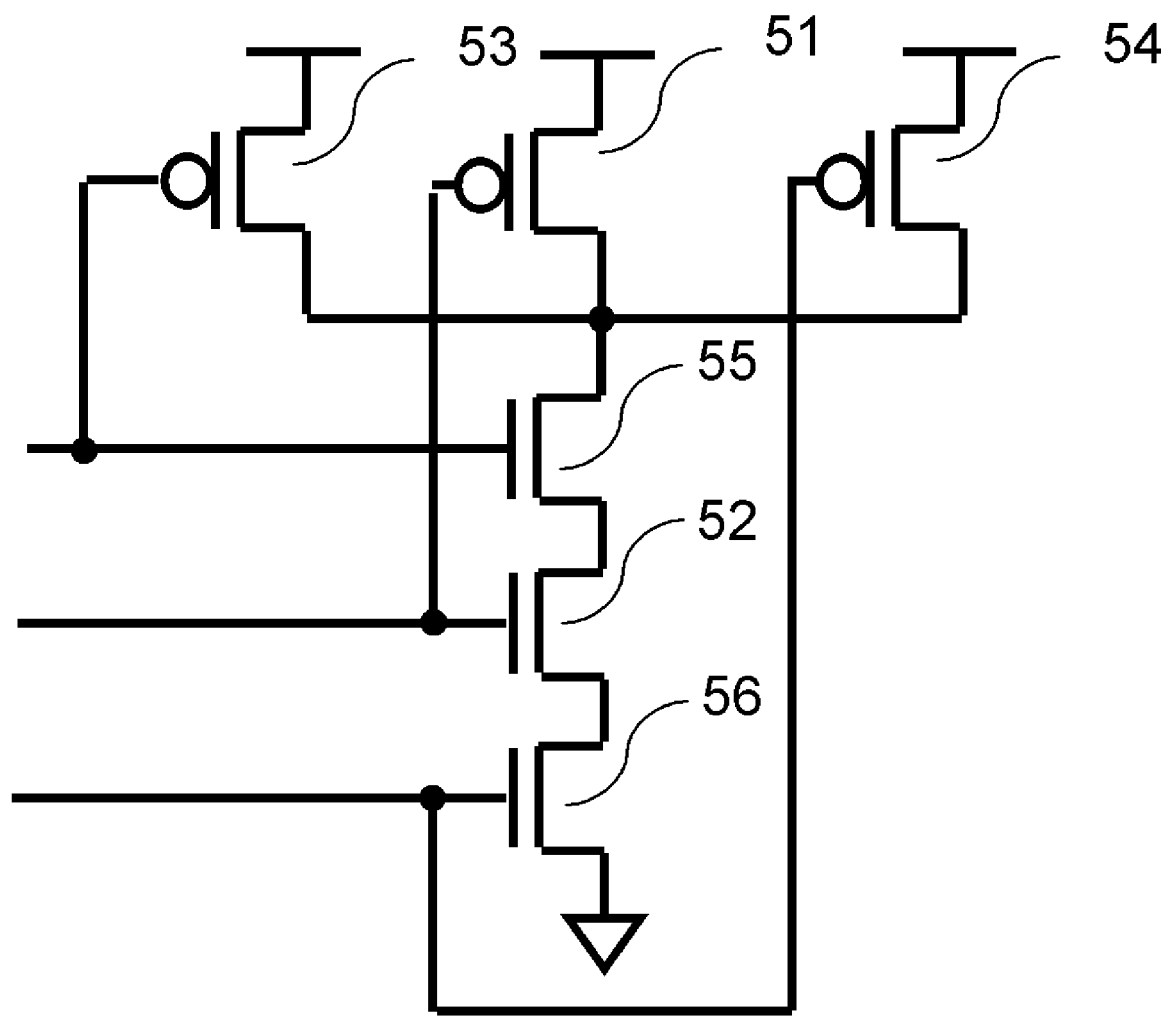
FIG. 10C is an equivalent circuit diagram of the capacitive load according to an embodiment of the present invention.

An equivalent circuit diagram of the capacitive load is shown in FIG. 10C. Gates of a PMOS transistor 51 and an NMOS transistor 52 represent the first input end of the NAND gate 31, gates of a PMOS transistor 53 and an NMOS transistor 55 represent the second input end of the NAND gate 31, and gates of a PMOS transistor 54 and an NMOS transistor 56 represent the third input end of the NAND gate 31.

FIGS. 11A and 11B are schematic views showing changes in parasitic capacitance caused by the NAND gate 31 at the output ends out and outb under different control signals. In FIG. 11A, when the control signal Ctrl is logic 0, a curve 61 is a schematic view showing changes in capacitance of the PMOS transistor 53, and a curve 62 is a schematic view showing changes in capacitance of the NMOS transistor 55. In FIG. 11B, when the control signal Ctrl is logic 1, a curve 63 is a schematic view showing changes in capacitance of the PMOS transistor 53, and a curve 64 is a schematic view showing changes in capacitance of the NMOS transistor 55.

When the control signal Ctrl is logic 0, no matter the logic level at the output end of the inverter 31 is 1 or 0, the PMOS transistor 54 is ON, and the NMOS transistor 56 is OFF. Thus, the output logic level of the NAND logic gate 31 is always 1, and the PMOS transistor 53 is turned on when the logic level at the output end of the inverter 31 is 0 and is turned off when the output level of the inverter 31 is 1. As the output logic level of the NAND logic gate 31 is 1, the NMOS transistor 55 cannot be turned on no matter the logic level at the output end of the inverter 31 is 1 or 0. When the control signal Ctrl is logic 1, the PMOS transistor 54 is OFF, and the NMOS transistor 56 is ON. Moreover, the capacitance of the PMOS transistor 53 changes with the output voltage, which is almost the same as the circumstance when the control signal Ctrl is logic 0, but with the following difference. When the output voltage is neither logic 0 nor 1, the NMOS transistor 55 is slightly turned on, such that the ON-range of the PMOS transistor 53 is slightly expanded, and thus the changes in capacitance of the same are somewhat increased. In addition, the capacitance of the NMOS transistor 56 also changes with the output voltage. The NMOS transistor 56 is temporarily turned on when the output level is neither 0 nor 1, and is turned off when the output level is 0 or 1. Thus, compared with the circumstance that the control signal Ctrl is logic 0, the NMOS transistor 56 has more changes in capacitance caused by temporary turn-on.

As the NAND gate 31 has two input signals as inverted signals, in a steady state, the NMOS transistor 55 in the NAND gate 31 is OFF. The steady state here refers to the circumstance when the logic level is 0 or 1. However, when the input signal is transited, and the voltage at the input end in of the inverter 31 is approximately equal to the voltage at the output end out of the inverter 31, the NMOS transistor 55 is slightly turned on, thus resulting in appreciable changes in capacitance. The transition here represents that the input signal is converted from logic level 0 to 1, or from logic level 1 to 0.

Figure 12:
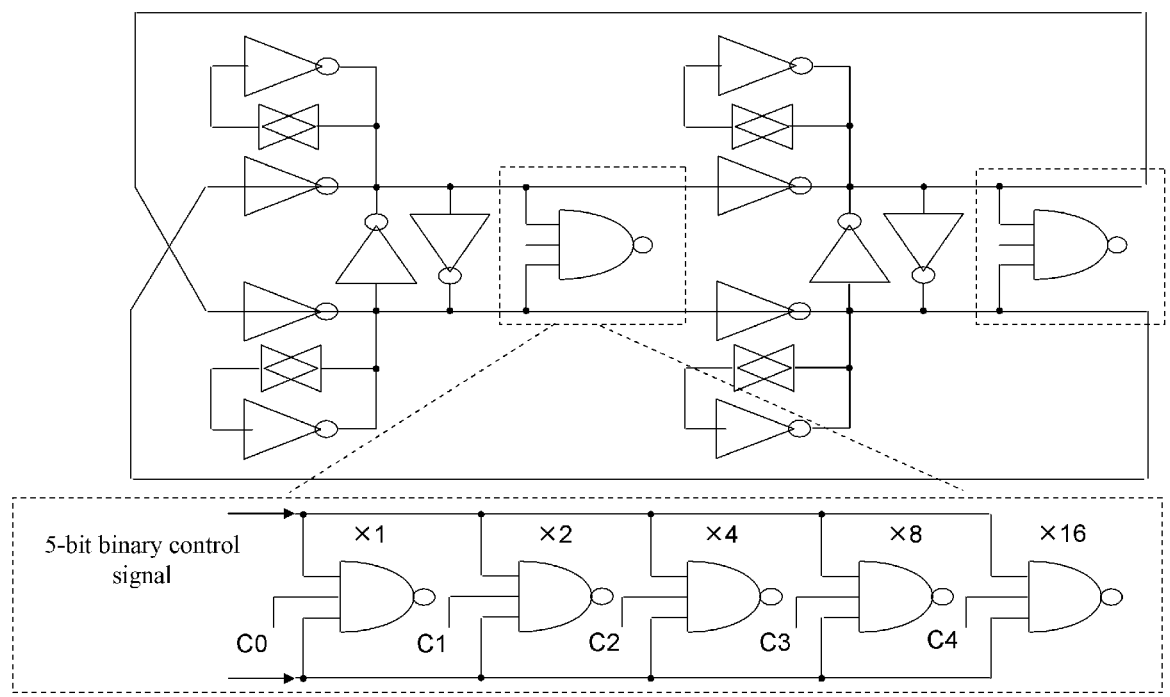
FIG. 12 is a schematic view of a simulator used for verifying the architecture of the present invention.

Referring to FIG. 12, a simulator used for verifying the architecture of the present invention is shown, in which a two-stage oscillator is adopted. A 0.18 µm process developed by TSMC is used for simulation. It should be noted that, it is a simplified figure with symbols all removed. In FIG. 12, the width/length ratio (W/L) of the NMOS transistors in the transmission gates is 0.45 µM/0.36 µm, and the W/L of the PMOS transistors is 1.87 µM/0.36 µm. The W/L of the PMOS transistors in the logic gates and the inverter is 1.87 µM/0.18 µm, and the W/L of the NMOS transistors is 0.45 µM/0.18 µm.

Figure 13:
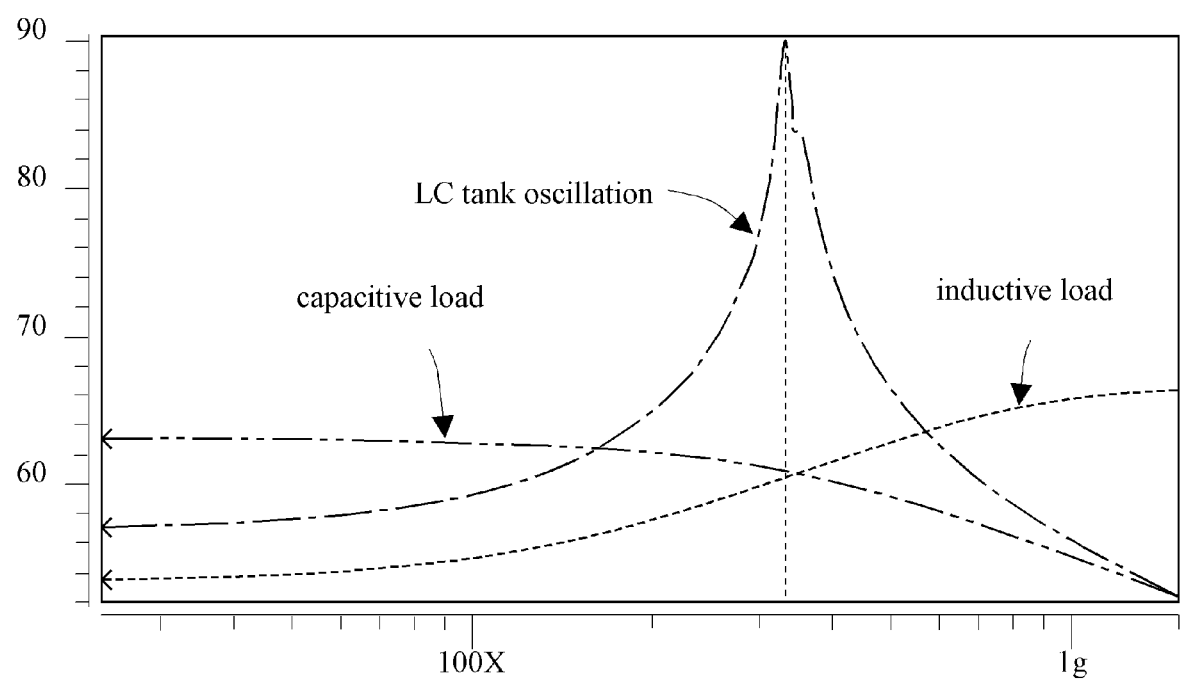
FIG. 13 shows the output impedance-frequency relationships of some modules and a comprehensive output impedance-frequency relationship.
Figure 14:
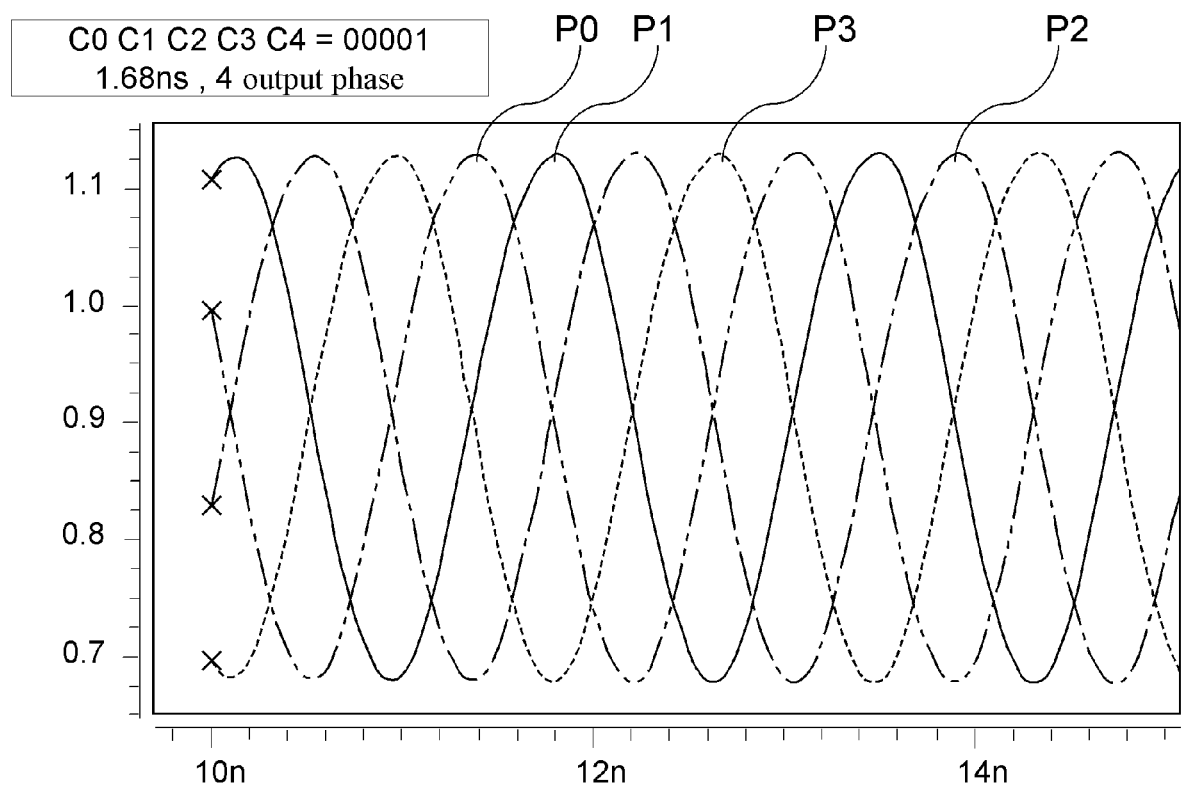
FIG. 14 shows the result of a time-domain simulation of FIG. 12.
Figure 15:
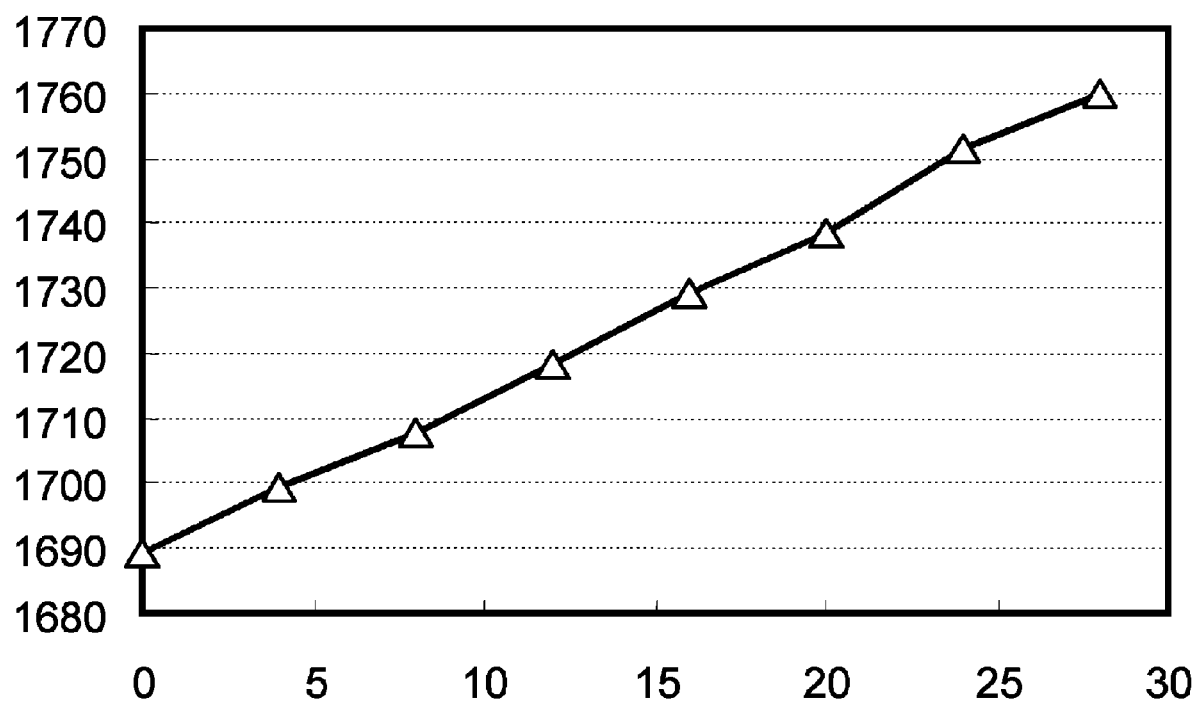
FIG. 15 is an external control signal-oscillation frequency curve of FIG. 12.

In the simulation of FIG. 12, the oscillation frequency is changed through the capacitive load. The capacitive load circuit is controlled in a 5-bit binary manner. FIG. 13 shows the output impedance-frequency relationships of some modules and a comprehensive output impedance-frequency relationship. FIG. 14 shows the result of a time-domain simulation, in which there are four output phases P0, P1, P2, P3, the oscillation frequency is about 600 MHz, and the output amplitude is about 0.45 V FIG. 15 is an external control signal-oscillation frequency curve, in which the cycle of the output clock varies from 1690 ps to 1760 ps, and the clock resolution is approximately 2.1 ps.

As the digital oscillator of the present invention is implemented by digital circuit units, the adoption of large-sized passive devices such as inductors, capacitors, and resistors, and large-sized active devices such as current sources are reduced. Thus, the circuit area is reduced.

What is claimed is:

1. An oscillator, comprising:
   a first inductive load circuit, for receiving a first signal, wherein the first inductive load circuit comprises a first inverter and a first transmission gate, and the first transmission gate is electrically connected between an input end and an output end of the first inverter;
   a second inductive load circuit, for receiving a second signal, wherein the second signal is an inverted signal of the first signal; and
   a capacitive load, respectively connected to the first inductive load circuit and the second inductive load circuit, for receiving the first signal and the second signal, wherein the capacitance of the capacitive load changes with a control signal.

2. The oscillator as claimed in claim 1, wherein the second inductive load comprises a second inverter and a second transmission gate, and the second transmission gate is electrically connected between an input end and an output end of the second inverter.

3. The oscillator as claimed in claim 2, further comprising:
   a third inverter for receiving a first input signal to invert and then output the first signal; and
   a fourth inverter for receiving a second input signal to invert and then output the second signal.

4. The oscillator as claimed in claim 3, wherein the first input signal and the second input signal are differential input signals.

5. The oscillator as claimed in claim 1, wherein the capacitive load circuit is an NAND gate.

6. The oscillator as claimed in claim 5, wherein the NAND gate has a first input end receiving the first signal, a second input end receiving the second signal, and a third input end receiving a control signal.

7. The oscillator as claimed in claim 5, wherein in a steady state, an N-type transistor in the NAND gate is turned off.

8. The oscillator as claimed in claim 5, wherein when the first signal is approximately equal to the second signal, the N-type transistor in the NAND gate is slightly turned on.

9. The oscillator as claimed in claim 1, wherein the capacitive load is a NOR gate.

10. The oscillator as claimed in claim 9, wherein the NOR gate has a first input end receiving the first signal, a second input end receiving the second signal, and a third input end receiving a control signal.

11. The oscillator as claimed in claim 1, wherein the capacitive load circuit comprises:
    a third transmission gate, having an input end and an output end interconnected for receiving the first signal, wherein a control end of the third transmission gate receives the control signal;
    a fourth transmission gate, having an input end and an output end interconnected for receiving the second signal, wherein a control end of the fourth transmission gate receives the control signal;
    a seventh inverter, for receiving, inverting, and then outputting the control signal to another control end of the third transmission gate; and
    an eighth inverter, for receiving, inverting, and then outputting the control signal to another control end of the fourth transmission gate.

12. The oscillator as claimed in claim 3, further comprising a noise reduction circuit electrically connected between the output end of the third inverter and the output end of the fourth inverter.

13. The oscillator as claimed in claim 12, wherein the noise reduction circuit comprises:
    a fifth inverter having an input end and an output end, wherein the input end of the fifth inverter is electrically connected to the output end of the fourth inverter and the output end of the fifth inverter is electrically connected to the output end of the third inverter; and
    a sixth inverter having an input end and an output end, wherein the input end of the sixth inverter is electrically connected to the output end of the third inverter and the output end of the sixth inverter is electrically connected to the output end of the fourth inverter.

14. The oscillator as claimed in claim 1, wherein the first inductive load circuit further comprising a capacitive load circuit.

15. The oscillator as claimed in claim 1, wherein the second inductive load circuit further comprising a capacitive load circuit.

16. An oscillator, consisting of a plurality of oscillators as claimed in claim 1.

* * * * *